United States Patent [19]
Lefévre

[11] 3,995,227
[45] Nov. 30, 1976

[54] ANALOG SIGNAL SAMPLE AMPLIFIERS
[75] Inventor: Georges Lefévre, Nantes, France
[73] Assignee: Societe d'Etudes, Recherches et Construtions Electroniques - Sercel, Carquefou, France
[22] Filed: July 2, 1974
[21] Appl. No.: 485,142

[30] Foreign Application Priority Data
July 5, 1973   France .............................. 73.24715

[52] U.S. Cl. ........................................ 330/9; 330/86
[51] Int. Cl.² ......................................... H03F 1/02
[58] Field of Search .............. 340/347 AD, 347 CC; 324/99 D, 115, 116; 330/9; 328/162

[56] References Cited
UNITED STATES PATENTS

| | | | |
|---|---|---|---|
| 3,283,319 | 11/1966 | Kaneko | 340/347 AD |
| 3,649,924 | 3/1972 | Lucas | 330/9 |
| 3,703,002 | 11/1972 | Van Saun | 340/347 AD |
| 3,737,794 | 6/1973 | Kurz | 330/9 |
| 3,778,710 | 12/1973 | Snook | 330/9 X |

*Primary Examiner*—Thomas J. Sloyan
*Attorney, Agent, or Firm*—Donald D. Jeffery

[57] ABSTRACT

A recirculatory analog signal sample amplifier having at least a first predetermined gain is provided with error determining means for recirculating a zero input signal with a second predetermined gain, thereby obtaining an error signal, and correction means to deduct from an incoming sample, before its circulation, a value proportional to the error signal.

4 Claims, 5 Drawing Figures

ANALOG SIGNAL SAMPLE AMPLIFIERS

BACKGROUND OF THE INVENTION

The present invention relates to an amplifier for analog signal samples, for use for example in the digitising to a high degree of precision of analog signals in the form of samples of such signals with the object of obtaining digital signals with a floating decimal point.

The progress made by the use of digital information, particularly with regard to its treatment, is explained by a general tendency to code, in digital form, analog signals supplied by numerous sources of very different kinds.

Generally the digitising of an analog signal consists in taking samples, measuring their amplitude and possibly their sign, the result of this measurement being expressed in the form of a coded digital signal.

When the dynamic range of the analog signals is increased, their digitising requires a large number of binary positions. This solution is therefore shown to be complicated and is difficult to put into practice, particularly if it is desired to maintain the same relative precision throughout the dynamic range.

For this purpose it has been proposed initially to amplify each sample with an adjustable binary gain so that the amplitude of each sample can be brought in the lower neighbourhood of a fixed value, known as the full-scale signal, and to carry out an analog-to-digital conversion of the thus-amplified sample with this full-scale signal as a measurement standard.

Digital signals with floating decimal point comprise two parts, a characteristic and a mantissa, each containing elementary binary information or bits.

According to this principle, a device has also been proposed capable of both amplifying samples of analog signals with automatic gain control in discrete values and effecting analog-to-digital conversion of each amplified sample. This device was the subject of a French patent application No. 72.00799 filed on Jan. 11, 1972 by Societe d'Etudes, Recherches et Constructions Electroniques S E R C E L relating to an "Amplifier for analog signal samples with automatic gain control, and a digitising circuit with floating decimal point for such samples" (U.S. patent application Ser. No. 322,333, filed Jan. 10, 1973 now U.S. Pat. No. 3,936,819.)

For amplification with automatic gain control in this device, the sample circulates in an amplification and delay memory circuit with application of a predetermined binary gain in each cycle. The circulation cycles are counted until the amplified sample reaches the lower neighbourhood of a full-scale signal, and this same number of circulations determines the characteristic of the sample.

One of the difficulties with this device arises from the fact that amplification and conversion are both carried out by the same components. In fact, the errors introduced by each component part, for example the offset voltage of the amplifiers, are repeated both in amplification and in conversion, which in the latter gives these errors a cumulative effect which is prejudicial to the accuracy of the conversion.

In particular, the samples of weakest value are those which need the greatest amplification. On these samples the cumulative amplification errors can become inadmissible for the required conversion accuracy.

This difficulty is all the more apparent if consideration is given to the variation, in terms of time, of the characteristics of the circuits, a variation caused in particular by changes in temperature.

The object of the present invention is to improve the amplification and analog-to-digital conversion circuits described in the abovementioned patent application to enable errors produced by the various circuit components to be compensated.

SUMMARY OF THE INVENTION

Since the amplification and conversion of a sample is carried out in a very short space of time, it may be assumed that the temperature remains constant and that the characteristics of the circuit do not alter during the time that a sample is being processed.

The principle of the invention is to determine, in the course of a preliminary phase, the errors introduced by the various components and, by the effect of a certain load, to remove them from the sample before amplification. Determination of the error load is such that the sample, after amplification, is reduced by a value substantially equal to the total error produced by the amplification.

According to the invention, a recirculatory amplifier for analog signal samples having at least a first predetermined circulation gain comprises:

error determining means for circulating a zero input signal with a second predetermined gain, to supply an error signal, and correction means for removing a value proportional to this error signal from the sample before its circulation.

The recirculatory sample amplifier preferably comprises a first amplifying circuit comprising a first differential amplifier with the said first gain in relation to its non-inverting input, a delay memory circuit for delayed application of the amplifier output signal to its input thus producing the circulation, the input of the first amplifier circuit for the sample being the non-inverting input of the differential amplifier, the error determining means comprises:

gain variation means for establishing the said second gain in relation to the non-inverting input of the first differential amplifier, and means for earthing this non-inverting input,
and the correction means comprises means for connecting the error signal to the inverting input of the first differential amplifier at the moment the sample is applied to its non-inverting input.

The differential amplifier is preferably provided with a negative feedback circuit consisting of a first resistance connected between the output and inverting input of the differential amplifier and a second resistance between the inverting input of the differential amplifier and ground, and the gain variation means comprises a third resistance between the inverting input and ground in parallel with the second resistance, these two resistances being suitable for connection alternatively to earth by means of a first and a second controlled switch.

The grounding means can comprise a third controlled switch connected between the non-inverting input of the amplifier and earth, and the correction means can comprise a fourth resistance and a fourth controlled switch connected in series between the delay memory circuit output and the inverting input of the amplifier, the delay memory circuit output not being able to be connected simultaneously to the inverting input and the non-inverting input of the first amplifier.

BRIEF DESCRIPTION OF THE DRAWINGS

Other characteristics and advantages of the invention will become apparent from reading the following detailed description with reference made to the accompanying drawings, which are provided solely by way of an unrestrictive example to illustrate the preferred embodiments of the invention, where.

The four embodiments shown in FIGS. 2, 3, 4 and 5 show four types of recirculatory amplifier corresponding respectively to FIGS. 2, 3, 4 and 5 of the abovementioned patent application, the differences between the four embodiments resulting from the structure of the delay memory circuit.

In the figures of the present application the components corresponding to the components in the abovementioned patent application are given the same references, and corresponding components in the various figures of the present application also bear the same references.

DESCRIPTION OF THE PREFERRED EMBODIMENTS

Figure 1:
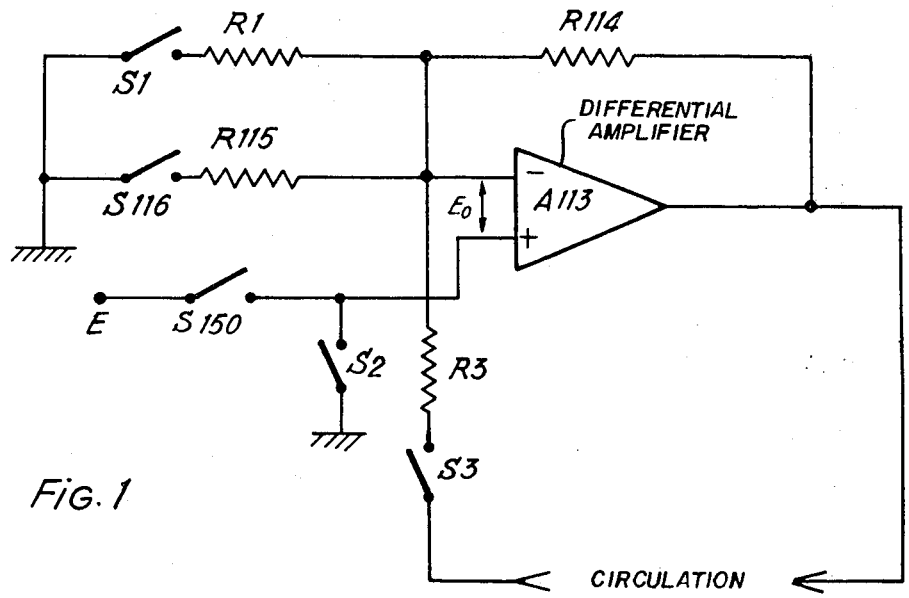
FIG. 1 is a general circuit diagram illustrating the principle of the invention.

FIG. 1 will first be described.

The accuracy of the amplification of a sample by circulation is limited by defects peculiar to the amplifiers and sampling circuits.

These defects are principally:

the thermal noise of the various components of the amplification circuit, the offset voltages currently called amplifier offsets, and the memory errors.

The values of the offset voltages of the amplifiers and memory errors are, in the present state of the art, much higher than the mean value of the thermal noise and may attain one hundred times the value of the latter. Amplification circuits embodying the invention enable the offset voltages and memory errors to be eliminated or greatly reduced, which in turn enables the possibilities of the recirculatory amplification circuits described in the abovementioned patent application to be utilized to the full. Thus amplification accuracy will only be limited by the noise.

In the abovementioned patent application a description is given of the amplifier circuits followed by digitising circuits. The offset voltages and memory error voltages may be limited in practice to values sufficiently low for the digitising result to remain unaffected. Thus the present invention is aimed at compensating only those errors produced during the amplification phase. The circuit diagrams are restricted to the amplification circuits without regard to the digitising circuits or to the comparison circuits which arrest the circulation of a sample by comparing with a predetermined threshold level. For a description thereof reference should be made to the aforementioned application Ser. No. 322,333.

The offset and memory error voltages are in practice invariable at a constant temperature. It will therefore be possible to eliminate these errors if one considers that the temperature variation of the circuits is negligible during the course of one amplification. Since in practice the duration of the amplification can be reduced to a fraction of a millisecond, it is reasonable to assume that the temperature remains constant throughout the amplification of one sample. It may therefore be assumed that the offset and memory error voltages are constant during an amplification phase.

FIG. 1 shows in diagrammatic form a differential amplification circuit comprising a negative feedback differential amplifier A 113. The non-inverting input of this amplifier is connected to the circuit input by a controlled switch S 150. The negative feedback circuit of this amplifier consists of a resistor R 114 connected between the output and the inverting input of the amplifier and a resistor R 115 connected to the inverting input of the amplifier and grounded by a controlled switch S 116. Connected in parallel with this second resistor is a resistor R 1 grounded by means of controlled switch S 1.

A controlled switch S 2 enables the non-inverting input of amplifier A 113 to be grounded.

A delay memory circuit is connected between the output of amplifier A 113 and its non-inverting input and is not shown, but part of it can be connected to the inverting input of amplifier A 113 by a controlled switch S 3 and a resistor R 3.

This diagram shows the various components of the general diagram of a circulation amplifier described in the abovementioned patent application with the exception of resistors R 1 and R 3 and controlled switches S 1, S 2 and S 3, these different components modifying the amplifying circuit to enable the offset and memory errors to be compensated.

In accordance with the invention a zero input signal circulates once by closing switch S2. Assuming amplifier A113 to have an error-determining gain $G_P$, the value of this gain is obtained by opening switch S116 and closing switch S 1.

Since the amplifier input signal is zero, its output signal is equal to the offset voltage Eo of the amplifier multiplied by the gain Gp.

After circulation the memory error in the delay memory circuit is added to this error. The resulting signal is transmitted to the inverting input of amplifier A 113 by closing switch S 3 at the same time as the sample is applied to the non-inverting input by closing switch S 150 after having previously opened switches S 1 and S 2. The output signal from amplifier A 113 will then be the sample signal subjected to a gain Ge to which will be added the offset voltage subjected to the same gain and from which will be deducted the error compensation voltage applied to the inverting input of the amplifier, this voltage being subject to the gain Gc.

The signal obtained is then amplified by circulation in the same way as described in the abovementioned patent application. The values of the resistances R 1 and R 2 are fixed so that the offset and memory errors can be eliminated for a given number of circulation cycles.

It will therefore be seen that a circulation amplification with error compensation requires one circulation cycle before sampling. Since the duration of this cycle is constant, all the samples will be put back by this same duration and this does not, therefore, present any difficulty.

Figure 2:
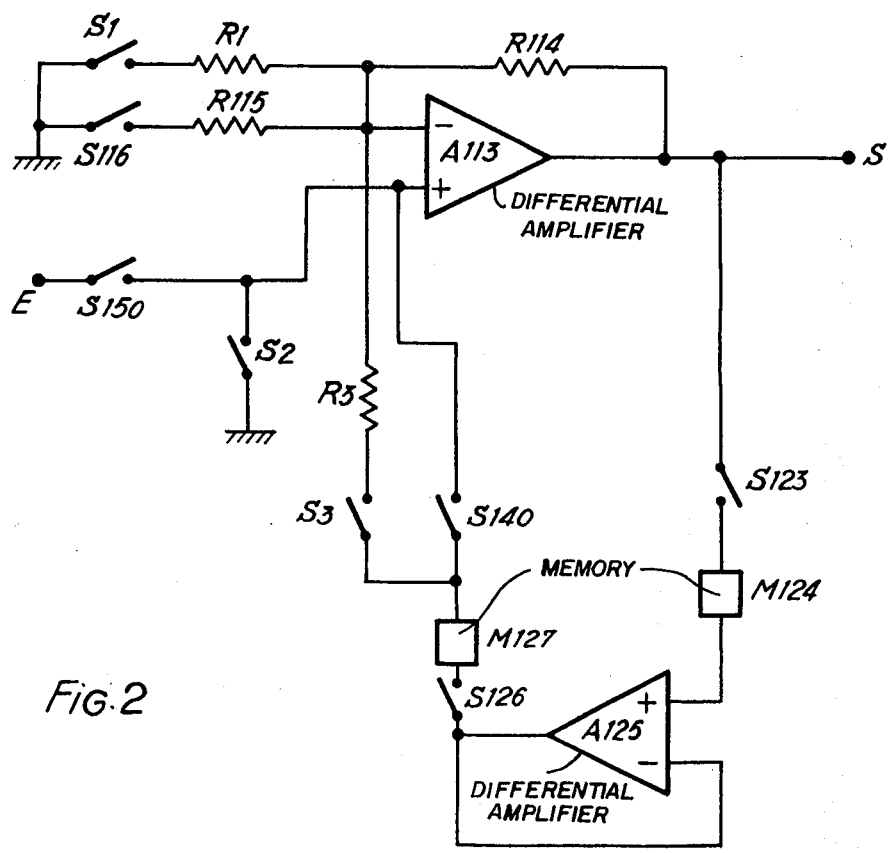
FIG. 2 is a circuit diagram of a first embodiment of the invention.

The first embodiment will now be described with reference to FIG. 2 with a detailed description for this embodiment of the operation of the circulation amplification circuit with error compensation together with the detailed calculation for determining resistances R 1 and R 3.

The circuit for the first embodiment is similar to that shown in FIG. 1 with a delay memory circuit composed of a first static memory M 124, whose input is connected to the output of amplifier A 113 by a controlled switch S 123. The output of this first static memory is connected to the input of an amplifier A 125 of unitary gain, whose output is connected to the input of a second static memory M 127 by a controlled switch S 126. The output of this second memory is connected to the non-inverting input of amplifier A 113 by a controlled switch S 140 and to the inverting input by means of switch S 3 and resistor R 3.

The error voltages to be compensated in this embodiment are:
 an offset voltage from amplifiers A 113 and 125, and
 the memory error voltages of memories M 124 and M 127.

Since the gain of amplifier A 125 is constant and equal to unity, its offset voltage is also constant, whatever the signal to be amplified. The total error due to memories M 124 and M 127 and amplifier A 125 is therefore constant and the voltage E 1 of this error will be noted.

Error voltages VP, VE, VA1, VA2, . . . VAN supplied by memory M 127 will be noted at the end of the following stages respectively:
 error determination
 sampling
 first amplification
 second amplification
 . . .
 nth amplification In a first phase which we shall designate "error determination" the non-inverting input of amplifier A 113 is earthed by closing switch S 2. Switches S 1 and S 123 are also closed and all the other switches are opened. The output signal of amplifier A 113, equal to $G_p \times E_o$ where $$G_p = \frac{R1 + R114}{R1},$$

is transferred to the memory M 124. Switch S 123 is then opened, and switch S 126 closed. The error signal to the output of memory M 127 is then:

$$VP = Gp.Eo + E\ 1$$

In the second phase, which is the "sampling phase", switches S 150, S 123 and S 3 are closed after opening switches S 2, S 1 and S 126. Switch S 123 is then open and switch S 126 closed, and the output signal of the amplifier A 125 to which are added the memory errors, is transferred to memory M 127. The error voltage at the output of memory M 127 is then:

$$VE = Ge.Eo - Gc.VP + E\ 1,$$

where $$Ge = \frac{R3 + R114}{R3}$$

and $$Gc = \frac{R3}{R114} = (Ge - 1)$$

Voltage VE only symbolizes the error voltage at the output of M 127, without including the voltage of the sampled signal which of course is amplified according to the operation described in the abovementioned patent application. The third phase is the first amplification phase. To carry out this phase, only switches S 116, S 123 and S 140 are closed. The signal is amplified by amplifier A 113 with gain G, transferred to memory M 124, then to memory M 127, by closing switch S 126 and opening switch S 123. The error voltage at the output of M 127 is then:

$$VA1 = G.VE + G.E. + E\ 1,$$

where $$G = \frac{R114 + R115}{R115}$$

The second amplification is carried out under the same conditions as the first, i.e.:

$$VA\ 2 = G.VA\ 1 + G.Eo + E\ 1$$

Finally, at the nth amplification, we have:

$$VAN = G.VA(N-1) + G.Eo + E\ 1$$

By grouping together the terms in Eo and in E 1 in the expression for voltage VAN, and by cancelling out their coefficients, the values for Gp and Ge are calculated as functions of G. These values enable the errors to be eliminated after N amplification cycles. Thus the values for R 1 and R 3 in terms of the value of R 114 and G may be deduced from the results.

The detailed calculation of resistances R 1 and R 3, the principle of which was given above, will now be described, i.e. by calculating the error voltages phase by phase:
Error Determination:

$$VP = Gp.Eo + E\ 1$$

Sampling:

$$VE = Ge.Eo + E\ 1 - Gc.VP$$

$$= Ge.Eo + E\ 1 - (Ge - 1).VP$$

$$\therefore VE = [Ge - Gp\ (Ge - 1)]Eo + [1 - (Ge - 1)]E\ 1$$

1st amplification:

$$VA\ 1 = G.EO + E\ 1 + G.VE$$

$$\therefore VA\ 1 = G.\ [1 + Ge - (Ge - 1)\ Gp\ ]Eo + [1 + G - (Ge - 1)\ G\ ]E\ 1.$$

2nd amplification:

$$VA\ 2 = G.Eo + E\ 1 + G.VA\ 1$$

$$\therefore VA\ 2 = G^2 .\ [1 + G^{-1} + Ge - (GE - 1)\ Gp]Eo + G^2 .\ [1 + G^{-1} + G^{-2} - (Ge - 1)]E\ 1$$

—Nth amplification (N > 1):

$$VAN = G.Eo + E1 + G.VA(N-1)$$
$$\therefore VAN = G^n.[1 + G^{-1} + G^{-2} + \ldots + G^{1-n} + Ge - (Ge-1)Gp]Eo + G^n.[1 + G^{-1} + G^{-2} + \ldots + G^{-n} - (Ge-1)].E1$$

For a given number $N$ of amplification cycles, the coefficients of $Eo$ and $E1$ may be cancelled, which enables the values to be determined for $Ge$ and $Gp$ as functions of $G$, values which eliminate the errors after $N$ amplification cycles. The values of $R1$ and $R3$ are then deduced from the following relations:

$$R1 = \frac{R114}{Gp-1}.$$

$$\text{and } R3 = \frac{R114}{Ge-1},$$

If $G^N$ is high, the geometrical progressions $$1 + G^{-1} + G^{-2} + \ldots + G^{-N}$$

may be replaced, without appreciable error, by the sum of the terms of the same progressions with an infinite number of terms:

$$1 + G^{-1} + G^{-2} + \ldots = \frac{1}{1 - G^{-1}} = \frac{G}{G-1}$$

The following is then obtained:

$$VAN = G^N \cdot [\frac{G}{G-1} + Ge - (Ge-1)Gp]Eo + G^N \cdot [\frac{G}{G-1} - (Ge-1)]E1.$$

To ensure that the error voltage is zero after N amplification cycles, it is necessary and sufficient for the coefficients of $Eo$ and $E1$ to be zero at the same time. The following is then obtained:

$$Ge = 1 + \frac{G}{G-1}$$
and
$$Gp = 1 + \frac{2G-1}{G}$$

which allows the following to be obtained:

$$R1 = R114 \cdot \frac{G}{2G-1}$$
and
$$R3 = R114 \cdot \frac{G-1}{G}$$

By giving R 1 and R 3 the above defined values the error voltage would be strictly zero for an infinite number of amplification cycles, but with the approximations made it may be assumed that it is also zero for a finite number of amplification cycles. This approximation will be explained in more detail later.

Figure 3:
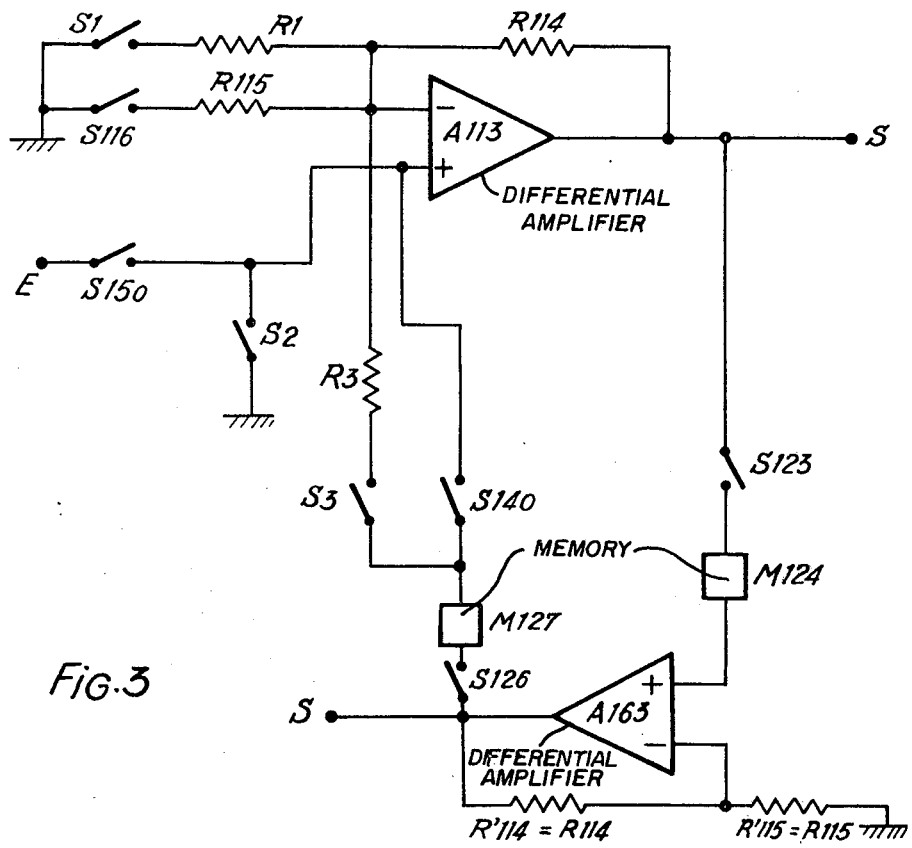
FIG. 3 is a circuit diagram of a second embodiment of the invention.

The second embodiment shown in FIG. 3 will now be described. This embodiment differs from the first embodiment only in that amplifier A 125 of unitary gain is replaced by an amplifier A 163 of the same gain as amplifier A113.

The various operational phases are similar to those for the operation of the first embodiment, with the exception that in the amplification phases the two amplifiers A 113 and A 163 play the same role and the signal can be extracted from the amplification circuit at the output of either of these two amplifiers.

An amplification cycle is therefore determined by the passage of the signal in one of the two amplifiers A 113 and A 163. Since the signal can only be extracted from the circuit at the output of the two amplifiers, if this signal is memorized in M 124, it will be amplified by A 163 when the output of the latter is connected to M 127 or to a suitable mechanism. Similarly, if the signal is memorized in M 127, it will be amplified by A 113. Thus we shall call the "amplification cycle" the circulation in either memory M 127 and amplifier A 113 or in M 124 and A 163. Each cycle commences on opening the switch upstream from the memory and ends when the signal leaves the amplifier. Thus the memory error voltages of M 124 and offset voltages of A 163 may be grouped together in a single error voltage designated E 1. As in the first error-determining phase, amplifier A 113 operates on the basis of a signal which is not extracted from M 127 and, a distinction will be made between offset voltage Eo of A 113 and memory error voltage E 2 of memory M 127.

The gain and voltage notations are similar to those of the first embodiment and the operational phases are also the same. The various stages in determining resistances R 1 and R 2 are given briefly below, this determination being carried out by a similar method to that in the preceding embodiment.

Error determination:

1st phase: passage through A 113

$$VP1 = Gp.Eo$$

2nd phase: passage through A 163

$$VP2 = G.VP1 + E1.$$

sampling: passage through A 113

$$VE = Ge.Eo - (Ge-1).(VP2 + E2)$$

1st amplification: passage through A 163

$$VA1 = G.VE + E1$$

2nd amplification: passage through A 113

$$VA2 = G.(VA1 + E2) + G.Eo$$

nth amplification: N even : passage through A 113

$$VAN = G.[VA(N-1) + E2] + G.Eo$$

N odd : passage through A 163

$$VAN = G.VA(N-1) + E1$$

By the same method as before, and with the same approximation, the following is obtained:

$$VAN = G^N \cdot [Ge - G \cdot Gp \cdot (Ge-1) + \frac{G}{G^2-1}]Eo$$
$$+ G^N \cdot [\frac{G}{G^2-1} - (Ge-1)]E1$$

$$+ G^N \cdot [\frac{G}{G^2-1} - (Ge-1)]E2$$

The coefficients of E 1 and E 2 are similar, hence the cancellation of the coefficients Eo, E 1 and E 2 is reduced to two equations and the following is obtained:

$$Ge = 1 + \frac{G}{G^2-1}$$
and
$$Gp = \frac{2G-1}{G^2} + 1.$$

Finally the following is obtained:

$$R1 = R114 \cdot \frac{G^2}{2G-1}$$
and
$$R3 = R114 \cdot \frac{G^2-1}{G}.$$

Figure 4:
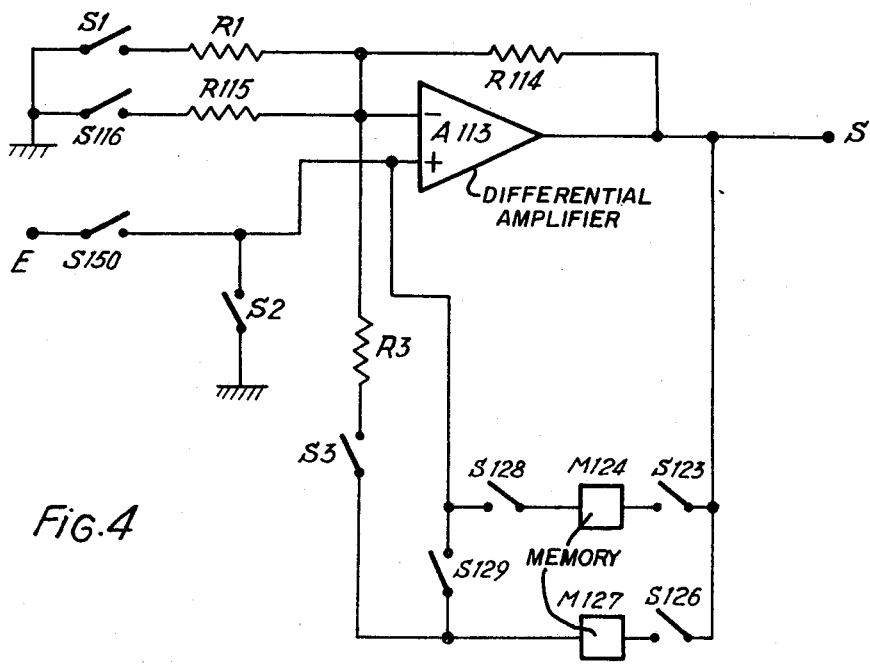
FIG. 4 is a circuit diagram of a third embodiment of the invention.

The third embodiment shown in FIG. 4 will now be described. Only the delay memory circuit is different from the two preceding embodiments. This circuit comprises two static memories M 124 and M 127 connected in parallel, and each being connected to the output of amplifier A 113 by controlled switches S 123 and S 126 respectively, and also connected to the non-inverting input of the same amplifier by controlled switches S 128 and S 129 respectively. The output of one of the two memories, M 127 in this example, is connected to the inverting input of amplifier A 113 by controlled switch S 3 and resistor R 3.

The recirculating signal is memorized at the output of amplifier A 113 or alternatively in memory M 124 and in memory M 127. An amplification phase is determined by the passage of the signal in amplifier A 113 and its memorization in one of the two memories. In the course of the error determining phase, the zero input signal circulates in the two memories and therefore passes twice into amplifier A 113.

The notations of the gains and voltages are similar to those of the preceding embodiments and the operational phases are also the same. E 1 is the memory error of M 124 and E 2 that of M 127.

The stages in determining resistances R 1 and R 3 will be given briefly below, the principle of this determination being similar to that of the preceding embodiments.
Error determination:
1st phase: memorization in M 124 with S 2 closed:

$$VP1 = Gp.Eo + E1$$

2nd phase: memorization in M 127 with S 2 opened and S 116 closed:

$$VP2 = G.VP1 + G.Eo + E2$$

Sampling with S 150 closed and S 116 open $$VE = Ge.Eo + E1 - (Ge-1)VP$$

1st amplification: memorization in M 127:

$$VA1 = G.VE + G.Eo + E2.$$

2nd amplification:

$$VA2 = G.VA1 + G.Eo + E1$$

Nth amplification:

$$VAN = G.VA(N-1) + G.Eo + E1 \text{ if } N \text{ is even}$$

$$VAN = G.VA(N-1) + G.Eo + E2 \text{ if } N \text{ is odd}.$$

In the same way as previously, and with the same approximation, the following is obtained:

$$VAN = G^N \cdot [\frac{G}{G-1} + Ge - (Ge-1)(Gp+1)G] \cdot Eo$$
$$+ G^{N+1} \cdot [\frac{G}{G^2-1} - (Ge-1)] \cdot E1$$
$$+ G^N \cdot [\frac{G}{G^2-1} - (Ge-1)] \cdot E2$$

The coefficients of E 1 and E 2 cancel for:

$$Ge = 1 + \frac{G}{G^2-1}$$

and the coefficient of Eo then cancels for:

$$Gp = 1 + \frac{2G-1}{G^2}.$$

The following is then obtained:

$$R1 = R114 \cdot \frac{G^2}{2G-1}$$

$$R3 = R114 \cdot \frac{G^2-1}{G}$$

It should be noted that these values for R 1 and R 3 are the same as those obtained in the second embodiment.

Figure 5:
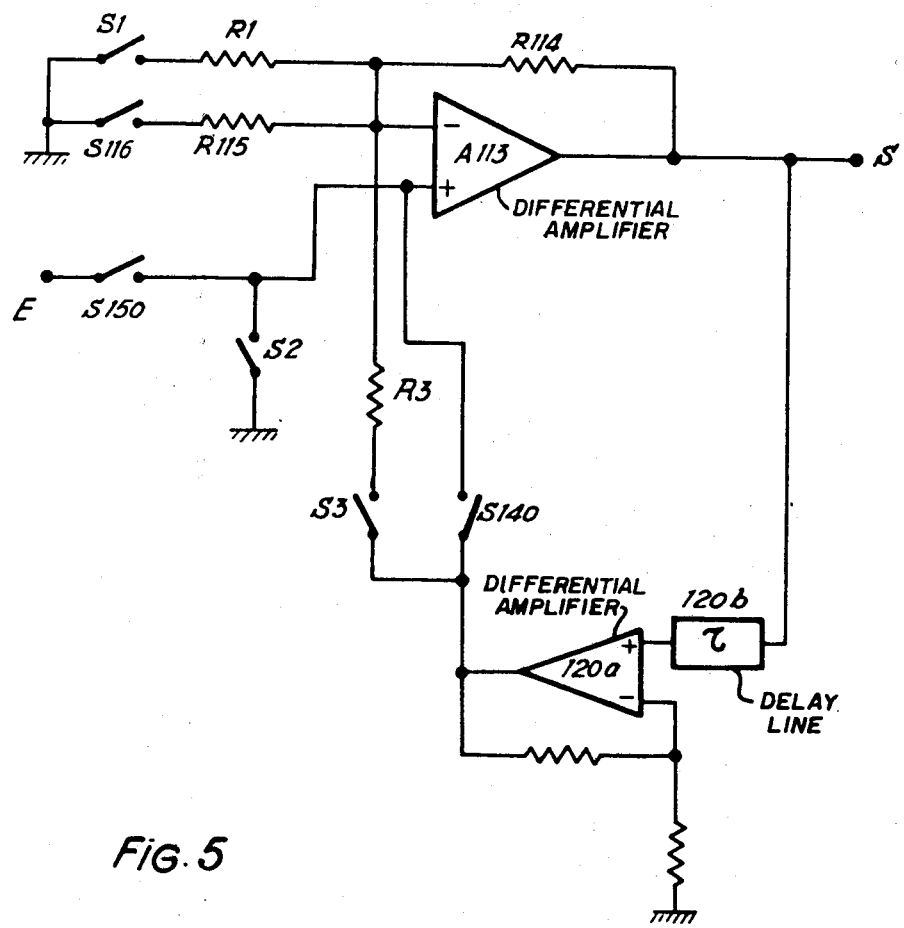
FIG. 5 is a circuit diagram of a fourth embodiment of the invention.

The fourth embodiment shown in FIG. 5 will now be described. Only the delay memory circuit differs from the preceding embodiments. This circuit comprises a delay line 120b, introducing a delay $\tau$, and an amplifier 120a, connected in series. The input of the delay line is connected directly to the output of amplifier A 113 and the output of the delay line is connected to the non-inverting and inverting inputs of amplifier A 113 by controlled switch S 140, and by controlled switch S 3, (through resistor R 3) respectively.

The delay line does not bring about a voltage offset but causes a loss in the level of the signals which traverse it. Amplifier 120a is designed to compensate for this loss of signal level, which is essential for amplification, but it introduces an offset voltage E 1. It may therefore be assumed that the delay memory circuit introduces a total error E 1 and it is clear that determination of resistances R 1 and R 3 is carried out in exactly the same way as the first embodiment with the same results, namely:

$$R1 = R114 \cdot \frac{G}{2G-1}$$
and
$$R3 = R114 \cdot \frac{G-1}{G}.$$

In the case of a constant gain amplification, all the samples complete the same number of amplification cycles and hence the same number of circulation cycles. In this case, error compensation can be accurate.

In fact is is possible to calculate the exact value of the two sums $1 + G^{-1} + G^{-2} + \ldots G^{-N}$ and $G^{-1} + G^{-3} + \ldots G^{-N}$ since these values have a limited number of terms.

However, it should be noted that in the second and third embodiments the error compensation may only be accurate where the number of amplification cycles is odd. In fact, it is only in this case that the coefficients of E 1 and E 2 are equal.

In the case of a variable gain amplification, the number of amplification cycles is variable according to the level of the sample. However, a maximum number of amplification cycles may be fixed which no sample is likely to exceed.

R 1 and R 3 may then be determined for this number of amplification cycles and error compensation will only be perfectly accurate where the sample is actually subjected to this number of amplification cycles.

If the resistances R 1 and R 3 are determined by means of the simplified formulae obtained above, by replacing the geometrical progressions with a limited number of terms by progressions with an infinite number of terms, the error introduced by this approximation is still acceptable.

In fact, for each of the embodiments the gains Ge and Gp are replaced by their value as a function of G, obtained after approximation in the error voltage expressions VE, VA1, VA2, ... VAN, in order to determine the errors produced after the sampling phase and each amplification cycle, the following is obtained:

1st and 4th embodiments:

$$VE = \frac{G}{G-1} \cdot Eo - \frac{1}{G-1} \cdot E1$$

$$VA1 = \frac{G}{G-1} \cdot Eo - \frac{1}{G-1} \cdot E1$$

$$VAN = \frac{G}{G-1} \cdot Eo - \frac{1}{G-1} \cdot E1$$

2nd embodiment:

$$VE = -\frac{G}{G^2-1} \cdot Eo - \frac{1}{G^2-1} \cdot E1 - \frac{G}{G^2-1} \cdot E2$$

$$VA1 = -\frac{G}{G^2-1} \cdot Eo - \frac{G}{G^2-1} \cdot E1 - \frac{1}{G^2-1} \cdot E2$$

$$VAN = -\frac{G}{G^2-1} \cdot Eo - \frac{1}{G^2-1} \cdot E1 - \frac{G}{G^2-1} \cdot E2 \text{ if } N \text{ is even}$$

$$VAN = -\frac{G}{G^2-1} \cdot Eo - \frac{G}{G^2-1} \cdot E1 - \frac{1}{G^2-1} \cdot E2 \text{ if } N \text{ is odd}$$

3rd embodiment:

$$VE = \frac{G}{G-1} \cdot Eo - \frac{1}{G^2-1} \cdot E1 - \frac{G}{G^2-1} \cdot E2$$

$$VA1 = -\frac{G}{G-1} \cdot Eo - \frac{G}{G^2-1} \cdot E1 - \frac{1}{G^2-1} \cdot E2$$

$$VAN = -\frac{G}{G-1} \cdot Eo - \frac{1}{G^2-1} \cdot E1 - \frac{G}{G^2-1} \cdot E2 \text{ if } N \text{ is even}$$

$$VAN = -\frac{G}{G-1} \cdot Eo - \frac{G}{G^2-1} \cdot E1 - \frac{1}{G^2-1} \cdot E2 \text{ if } N \text{ is odd}$$

It will be observed that in the four embodiments the errors are not amplified, hence the relative total error in relation to the sampled voltage is practically independent of the size of this voltage.

The error introduced by the approximation of a series with a limited number of terms by a series with an infinite number of terms is therefore completely acceptable.

The principal error introduced by the method is due to the difference between the number of amplification cycles actually completed and the number of cycles for which resistances R 1 and R 3 have been determined.

The most unfavorable case for inaccuracy of the error compensation is the case of a sample which is not to be amplified and is extracted from the circuit after its passage in the differential amplifier, and hence not passing with amplification into the delay memory circuit. In fact, in this case, if the amplification circuit did not include any error compensation, the errors introduced to the sample would be equal to the sum of the errors of the various components.

Normally the error is limited to the input of the main amplifier, i.e. the error voltage to be added to the input signal of the circuit will be determined to obtain the same error at the output, and assuming that none of these components introduces any error voltage.

In order to do this it is sufficient to determine the ratio of the sampling voltage to the sampling gain.

1st and 4th embodiments:

$$\frac{VE}{Ge} = \frac{-\frac{G}{G-1} \cdot Eo - \frac{1}{G-1} \cdot E1}{1 + \frac{G}{G-1}}$$

$$\frac{VE}{Ge} = \frac{G}{2G-1} \cdot Eo - \frac{1}{2G-1} \cdot E1$$

2nd embodiment:

$$\frac{VE}{Ge} = -\frac{G}{G^2+G-1} \cdot Eo - \frac{1}{G^2+G-1} \cdot E1 - \frac{G}{G^2+G-1} \cdot E2$$

3rd embodiment:

$$\frac{VE}{Ge} = -1 + \frac{1}{G^2 + G - 1} \cdot Eo - \frac{1}{G^2 + G - 1} \cdot E1 - \frac{G}{G^2 + G - 1} \cdot E2$$

In the first, second and fourth embodiments the error is less than that which would be caused by the various components without error compensation. In fact, without error compensation the error would be equal to the sum of the errors caused by each of the components of the circuit when these embodiments, the coefficients of Eo, E 1 and E 2 being lower than unity, the error is less than the sum of the errors produced by each of the components in the circuit.

In the third embodiment, the coefficient of Eo is higher than unity but, because the gain G is always greater than 2, this coefficient is only slightly greater than unity.

Determination of the resistances R 1 and R 3 for automatic variable gain operation by means of the simplified formulae therefore enables an error compensation to be made, which even in the most unfavorable cases improves the accuracy of the sample amplification.

Of course the four embodiments described are only preferred and it is possible to apply the principle of error compensation to other recirculatory amplification circuits without departing from the scope of the present invention.

What is claimed is:

1. In a variable gain sampling amplifier of the recirculation type having amplifying means, circulating means for multiple recirculation of the output of the amplifying means to the input of the amplifying means, and means for controlling said circulating means in order to first apply a signal sample to the input of the amplifying means and subsequently recirculate several times with a delay the successive output signals of the amplifying means, said amplifying means having a first predetermined gain with respect to said input during each circulation and being subject to an internal offset input signal for a zero external input signal, the improvement comprising:
    switch means for grounding end subsequently undergrounding the input of the amplifying means prior to the application of a signal sample to the variable gain amplifier;
    means for applying a second predetermined gain to the amplifying means while said input thereof is grounded, whereby said circulation control means is activated to circulate once the output voltage of the grounded-input amplifying means, and for re-applying said first predetermined gain to said amplifying means after the last mentioned circulation, which circulation is thus providing an error signal at the output of the circulating means, said error signal resulting from the offset signal amplified with second predetermined gain and from errors due to the circulating means; and
    means effective upon application of a signal sample at the input of the amplifying means for subtracting from said signal sample a value proportional to the error signal said subtracting means including gain modifying means connected to said amplifying means for applying the corrected input sample to said amplifier for amplification with a third predetermined gain and subsequent multiple recirculation, whereby the offset errors due to said amplifier and errors due to said circulating means are substantially compensated.

2. A variable gain amplifier according to claim 1, wherein said amplifying means is a differential amplifier having an inverting input and a non-inverting input, said input of the amplifying means is said non-inverting input, and said subtracting comprises:
    circuit means for coupling said error signal to said inverting input through said gain-modifying means simultaneously with the application of a sample signal to the non-inverting input of the differential amplifier,
    said circuit means thereby applying to the differential amplifier a fourth predetermined gain for the error signal coupled to said inverting input, while it has said third predetermined gain for the signal sample at its non-inverting input, said third predetermined gain being one plus the fourth predetermined gain.

3. A variable gain amplifier according to claim 2, wherein the first gain is G, the second gain is $$1 + \frac{2G-1}{G^2},$$

and the third gain is $$1 + \frac{G}{G^2 - 1}.$$

4. An amplifier according to claim 3, comprising a first resistor coupled between the output and the inverting input of said differential amplifier, a second resistor coupled between said inverting input and ground, a third resistor parallel to said second resistor, and means in series with said second and third resistors for connecting either one of said second and third resistors to ground, thereby applying to said differential amplifier either said second or said third predetermined gain, respectively, a fourth resistor connected at the output of the circulating means, and means for connecting said fourth resistor to said inverting input of said differential amplifier during application of a sample signal at the non-inverting input, and wherein the value of the first resistor is R, the value of the second resistor is substantially $$R \frac{G^2}{2G-1},$$

and the value of the fourth resistor is substantially $$R \frac{G^2 - 1}{G}.$$

* * * * *